United States Patent [19]

Nix et al.

[11] Patent Number: 5,020,025
[45] Date of Patent: May 28, 1991

[54] CAPACITIVELY COUPLED READ-ONLY MEMORY

[75] Inventors: Michael Nix; Clayton D. English, both of Austin, Tex.

[73] Assignee: Advanced Micro Devices, Inc., Sunnyvale, Calif.

[21] Appl. No.: 462,625

[22] Filed: Jan. 9, 1990

[51] Int. Cl.$^5$ .................. G11C 17/04; G11C 11/24
[52] U.S. Cl. ..................... 365/102; 365/94; 365/140; 365/210
[58] Field of Search ............ 365/102, 94, 210, 149

[56] References Cited

U.S. PATENT DOCUMENTS

| | | | |
|---|---|---|---|
| 3,461,436 | 8/1969 | Navon et al. | 265/102 |
| 3,593,319 | 7/1971 | Barber | 365/102 |
| 3,611,321 | 10/1971 | Baer | 365/102 |
| 3,654,499 | 4/1972 | Smith | 365/102 |
| 3,737,874 | 6/1973 | Hess et al. | 365/102 |
| 3,827,032 | 7/1974 | Abbott et al. | 365/102 |
| 4,301,519 | 11/1981 | Lee | 365/210 |

OTHER PUBLICATIONS

"Capacitor Read-Only Store", by S. W. Draper et al., IBM Technical Disclosure Bulletin, vol. 7, No. 12, May 1965.

Primary Examiner—Joseph A. Popek
Assistant Examiner—Michael A. Whitfield
Attorney, Agent, or Firm—Foley & Lardner

[57] ABSTRACT

A read-only memory for storing a plurality of bits of information. The read-only memory includes a plurality of memory cells arranged in an array with each memory cell including a capacitor having either a relatively high capacitance or a relatively low capacitance representing a bit of stored information. The read-only memory further includes a reading means for accessing each memory cell and providing a first or second output responsive to the capacitance level of the memory cell capacitance means.

20 Claims, 3 Drawing Sheets

CAPACITIVELY COUPLED READ-ONLY MEMORY

BACKGROUND OF THE INVENTION

The present invention generally relates to read-only memories and more particularly to a read-only memory wherein the memory cells thereof incorporate relatively high or relatively low capacitances representing bits of information permanently stored therein.

Read-only memories find considerable application in modern electronic equipment, such as computers, and micro-processors. Read-only memories provide the function of permanently storing information in bits of binary data. The binary data may be used, for example, to define fixed program instructions in a processor or computer of electronic systems. The type of fixed instructions determines the function to be performed by the system. For example, one set of stored instructions may cause a system to act as a controller for manufacturing operations. Another set of instructions may cause the system to act as calculator. Still another set of instructions may cause a system to function as a switchboard in a communications or information network. Obviously, read-only memories take an important role in the modern, electronic technology of today.

Read-only memories are generally implemented in integrated circuit form. One form of read-only memory utilizes an MOS transistor at each memory cell. A completed MOS transistor may be used to represent a stored binary "1" while an incomplete MOS transistor at a memory cell may be used to represent a stored binary "0". Whether such an MOS transistor is completed or not depends on whether an effective gate electrode is provided the transistor during the integrated circuit processing. An effective gate electrode is provided by forming a thin oxide region between the transistor source and drain electrodes and a row address line overlying the transistor source and drain. The oxides are first formed to be relatively thick and a selective etching process is used to reduce the oxide thickness to a thin oxide in selected areas. When the row address lines are formed, they become the gate electrodes for those transistors having thin oxides selectively etched over their gate and source electrodes.

While the foregoing read-only memories have found wide acceptance in the art, there remains room for improvement. For example, a selective-etch process to form the thin oxide regions must be accurately and carefully controlled to achieve the desired oxide thicknesses to assure that only the desired transistors to be completed are, in fact, completed. Also, because source and drain electrodes must be formed, small processing feature sizes must be used to obtain acceptable cell size. Cell size is particularly important because it determines memory packing density. The memory packing density of the foregoing type of read-only memory has been limited by feature size.

The read-only memory of the present invention overcomes the aforementioned deficiencies in the prior art. The read-only memory of the present invention does not require a selective etch to provide selective areas of thin oxides, and does not require the formation of transistors. The read-only memory therefore results in memory cells of smaller size and thus, increased packing density.

SUMMARY OF THE INVENTION

The present invention therefore provides a read-only memory for storing plural bits of information. The read-only memory includes a plurality of memory cells arranged in an array, each memory cell including capacitor means having a relatively high capacitance or a relatively low capacitance for representing a bit of information stored therein.

The invention further provides a read-only memory for storing a plurality of bits of information, wherein the read-only memory includes a plurality of memory cells in an array of a plurality of substantially parallel rows and a plurality of substantially parallel columns, each row being substantially perpendicular to the columns. The read-only memory further includes a corresponding plurality of substantially parallel row conductors and substantially parallel column conductors, the row conductors being substantially perpendicular to the column conductors, and wherein each memory cell includes capacitor means coupled between a respective different pair of the row and column conductors. The capacitor means have a relatively high capacitance or a relatively low capacitance representing a bit of stored information. The read-only memory further includes reading means for accessing each memory cell and providing a first or second output responsive to the capacitance level of the memory cell capacitance means.

BRIEF DESCRIPTION OF THE DRAWINGS

The features of the present invention which are believed to be novel are set forth with particularity in the appended claims. The invention, together with further objects and advantages thereof, may be understood by making reference to the following description taken in conjunction with the accompanying drawings, in the several figures of which like reference numerals identify identical elements, and wherein:

DESCRIPTION OF THE PREFERRED EMBODIMENT

Figure 1:
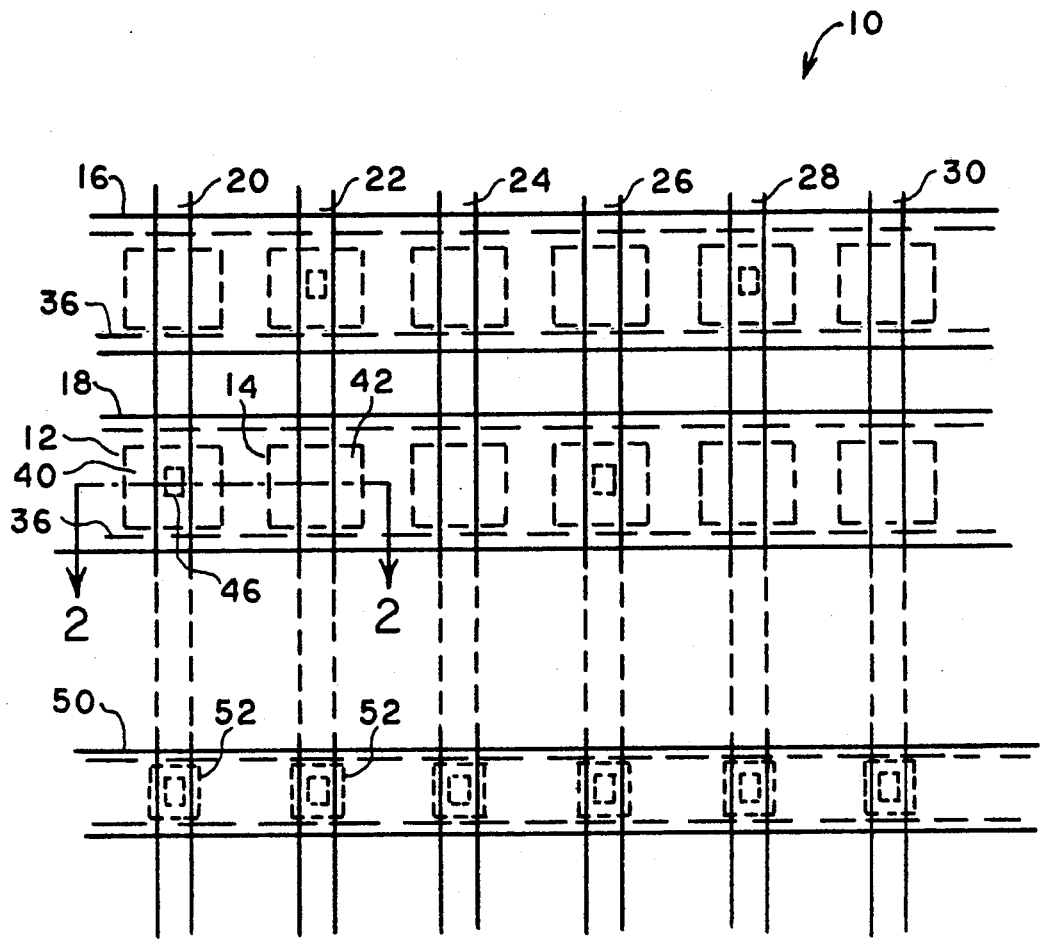
FIG. 1 is a partial top-plan view of a read-only memory embodying the present invention.
Figure 2:
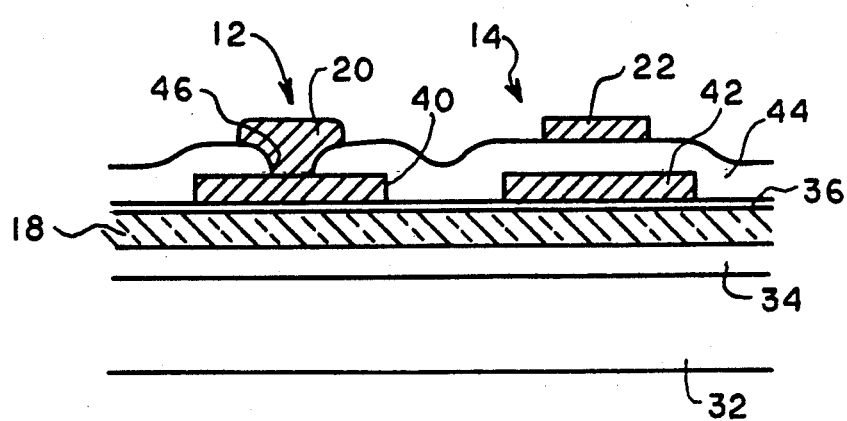
FIG. 2 is a cross-sectional view taken along lines 2—2 of FIG. 1.

Referring now to FIGS. 1 and 2, FIG. 1 is a partial top-plan view of a read-only memory ("ROM") 10 embodying the present invention and FIG. 2 is a cross-sectional view taken along lines 2—2 of FIG. 1. The ROM 10 generally includes a plurality of memory cells, such as memory cells 12 and 14. Each memory cell is disposed between one of a plurality of word or row conductors or lines 16 and 18 and one of a plurality of column conductors or lines 20, 22, 24, 26, 28 and 30.

As can be noted in FIG. 2, the memory cells are formed on a substrate 32. The substrate 32 may be formed from crystalline silicon, for example. Formed over the substrate 32 is a field oxide 34 which forms a first insulating layer over the silicon substrate 32. The field oxide 34 may be thermally grown, for example, and thus comprise silicon oxide. The plurality of word or row conductors are formed over the field oxide 34 and are disposed substantially parallel to one another. The word lines, 16 and 18, form a first conductor for each memory cell and may comprises, for example, doped polycrystalline silicon. As is well known, doped polycrystalline silicon has very good electrical conductivity.

Formed over each of the doped polycrystalline word lines 16 and 18 is a second insulator 36. As can be seen in FIG. 2, the second insulator 36 is relatively thin. It may be formed by using a chemical vapor deposition process and may comprise phosphorous-doped glass.

Each of the memory cells includes a conductor region, such as conductor regions 40 and 42 of memory cells 12 and 14 as illustrated in FIG. 2. The conductor regions are confined within the margins of the insulating layer 36 and is spaced apart, so as to be isolated from one another. The third insulating layer 44 is next formed over all of the conductor regions and the surface areas therebetween. A third insulating layer 44 as illustrated in FIG. 2 is relatively thick. It may be formed from glass in a chemical vapor deposition process of the type well known in the art.

The resulting structure thus far described may be stored for later programming. When the ROM 10 is to be programmed, pores are formed in the third insulating layer 44 above the conductor regions of the memory cells which are to have a resulting high capacitance and pores are not formed for those memory cells which are to have a relatively low capacitance. As shown in FIG. 2, a pore 46 has been formed in the third insulating layer 44 above the conductor region 40 while such a pore has not been formed in the insulating layer 44 above the conductor region 42. As will be seen hereinafter, memory cell 12 is thus programmed for a high capacitance and memory cell 14 is programmed for a low capacitance. After the pores are selectively formed in the third insulating layer 44, the column conductors or lines 20 through 30 are formed so as to be substantially parallel with on another and substantially perpendicular to the word lines 16 and 18. As can be seen in FIG. 2, the column conductor 20 extends through the pore 46 and contacts the conductor region 40 of memory cell 12 while column conductor 22 is insulated from the conductor region 42 of memory cell 14.

With respect to memory cell 12, the row conductor 18, the thin insulating layer 36, and the metallic region 40 forms a capacitance means having a relatively high capacitance between the row line 18 and the column conductor 20. In contrast, and with respect to memory cell 14, the row line 18, the thin insulating layer 36, the conductor region 42, the third insulating layer 44, and the column conductor 22 form a capacitance means having a relatively low capacitance between row line 18 and column conductor 22. The relatively low capacitance results because the memory cell 14 includes two capacitors which are series coupled between the row line 18 and the column conductor 22. The two series coupled capacitors include a first capacitor formed by the row line 18, the thin insulating layer 36, and the conductor region 42 and a second capacitor formed by the conductor region 42, the third insulating layer 44 and the column conductor 22. Since the third insulating layer 44 is relatively thick, the second capacitor has a much lower capacitance than the first capacitor. The first capacitor has a capacitance substantially equal to the relatively high capacitance of the memory cell 12 and in accordance with this preferred embodiment, is on the order of 0.1 picofarads. The second capacitor has a relatively low capacitance, and, in accordance with this preferred embodiment, is on the order of 1/10th the capacitance of the first capacitor. Hence, if the capacitance of the capacitance means of the memory cell 12 has a capacitance of C, the relatively low capacitance of memory cell 14 will be on the order of 1/10 C.

As will be disclosed hereinafter, the ROM 10 includes reading means which accesses each of the memory cells and which senses whether a memory cell is of a high capacitance or a low capacitance. The capacitance level of the capacitance means of a memory cell, therefore, can be used to represent stored binary information. For example, a memory cell having relatively high capacitance may be considered a binary zero, while a memory cell having a capacitance means of relatively low capacitance may be considered a binary one.

To enable the reading of the memory cells of the ROM 10, the ROM 10 further includes a reference line 50 which extends substantially parallel to the row lines 16 and 18. Disposed between the reference line 50 and each of the column lines 20 through 30 is a reference capacitor 52 which may be formed in the same manner as the relatively high capacitance means illustrated in FIG. 2 with reference to memory cell 12. Each of the reference capacitors 52, in accordance with this preferred embodiment, has a capacitance substantially equal to one-half the capacitance of the relatively high capacitance capacitance means previously described with respect to the memory cell 12 of FIG. 2. As a result, the reference capacitors will have a capacitance of one-half C.

Figure 3:
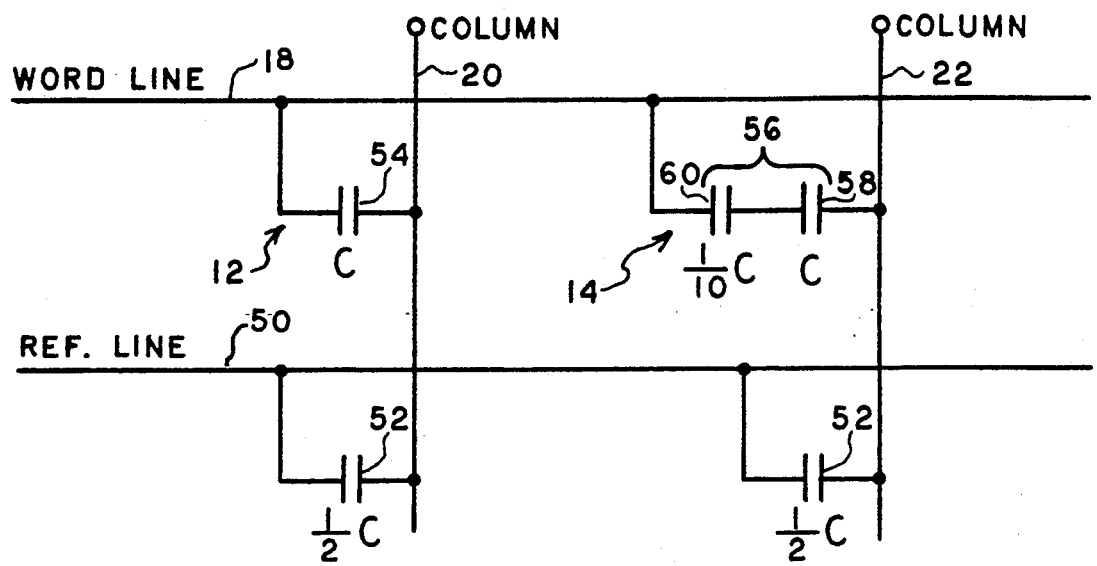
FIG. 3 is an equivalent circuit diagram of the memory cells illustrated in FIG. 2.

Referring now to FIG. 3, it provides an equivalent circuit diagram of the memory cells 12 and 14 illustrated in FIG. 2 in conjunction with the reference line 50 and reference capacitor 52. As can be seen in FIG. 3, memory cell 12 includes a capacitance means 54 having a relatively high capacitance, C, between the word line 18 and the column conductor 20. Memory cell 14 includes a capacitance means 56 comprising the first capacitor 58 having a relatively high capacitance, C, in series with a second capacitor 60 having a relatively low capacitance, one-tenth C. The first capacitor 58 and second capacitor 60 are coupled in series between the word line 18 and the column conductor 22.

The reference line 50 extends substantially parallel to the word line 18 and is this substantially perpendicular to the column conductors 20 and 22. Disposed between the reference line and each column conductor is a reference capacitor 52 having a capacitance of one-half C.

Figure 4:
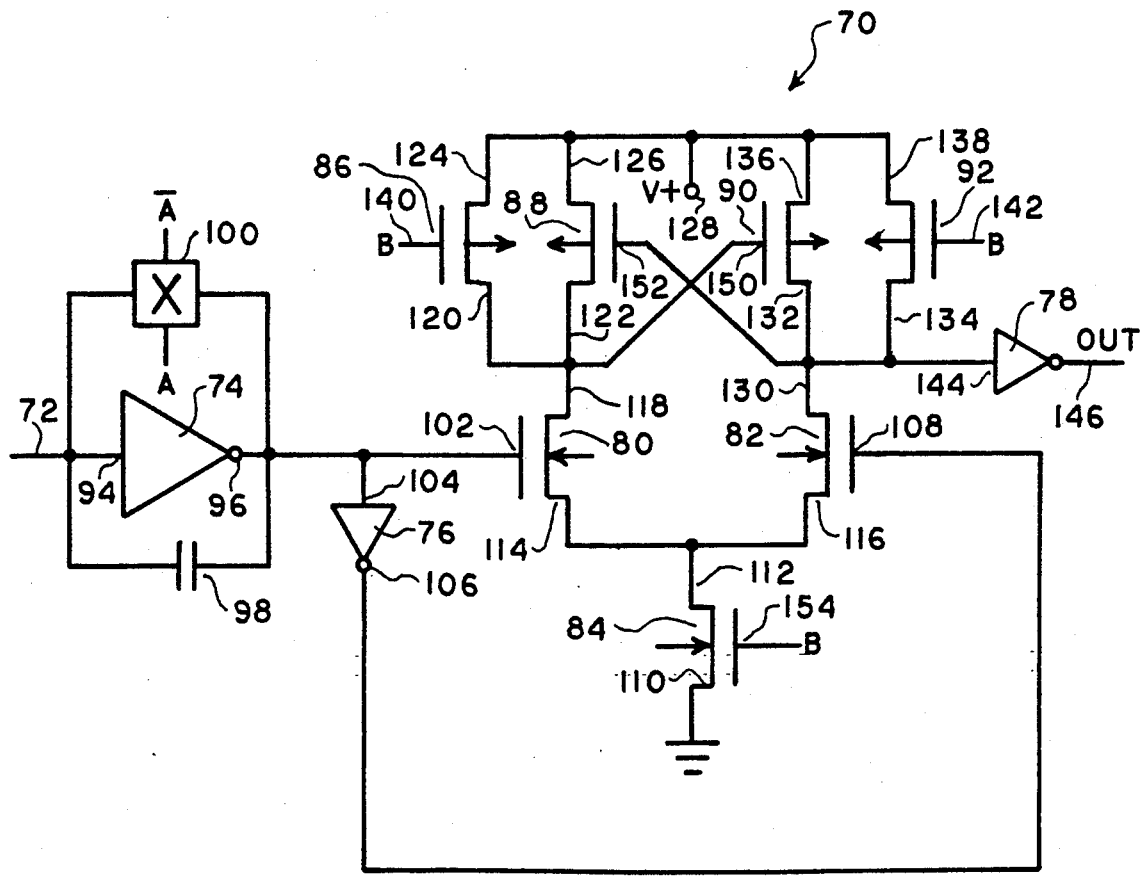
FIG. 4 is a schematic circuit diagram of a sense amplifier which may be provided to each column conductor of the read-only memory of FIG. 1.

Referring now to FIG. 4, it illustrates in schematic circuit diagram form, a sense amplifier 70 which may be utilized for sensing the relatively high or relatively low capacitances of the memory cells associated with one of the column lines. In a practical read-only memory, one such sense amplifier 70 would be coupled to a respective given one of the column lines.

The sense amplifier 70 includes an input 72 arranged to be coupled to one of the column lines of the read-only memory. The sense amplifier 70 generally includes inverters 74, 76 and 78, N-channel field-effect transistors 80, 82 and 84, and P-Channel field-effect transistors 86, 88, 90 and 92.

The input 72 of the sense amplifier 70 is coupled to an input 94 of inverter 74. Coupled across the output 96 and input 94 of the inverter 74 are a capacitor 98 and a CMOS switch 100. The switch 100 is of the type well known in the art comprising a P-Channel field-effect transistor coupled in parallel with an N-Channel filed-effect transistor. The input A is coupled to the gate of the N-Channel field-effect transistor and the A input is coupled to the gate of the P-Channel field-effect transistor. When the input A is high and the input A is low, the switch will be closed to couple the output 96 of inverter 74 to its input 94. When the input A is low and the input A is high, the switch will be opened to decouple the output 96 of inverter 74 from its input 94. As will be seen hereinafter, when a memory cell is to be read, the switch 100 is opened and at other times, the switch 100 is closed.

The output 96 of inverter 74 is coupled to the gate 102 of the N-Channel field-effect transistor 80. The output 96 of inverter 74 is also coupled to the input 104 of inverter 76 which in turn has an output 106 coupled to the gate 108 of N-Channel filed-effect transistor 82.

N-Channel field-effect transistor 84 has a source 110 coupled to ground potential and a drain 112 coupled to the source 114 of N-Channel filed-effect transistor 80 and the source 116 of N-Channel field-effect transistor 82. The drain 118 of N-Channel filed-effect transistor 80 is coupled to the drains 120 and 122 of P-Channel field-effect transistors 86 and 88 respectively and to the gate 150 of P-Channel filed-effect transistor 90. The sources 124 and 126 of P-Channel field-effect transistors 86 and 88 are coupled respectively to a positive voltage source at a terminal 128.

Similarly, the drain 130 of N-Channel filed-effect transistor 82 is coupled to the drains 132 and 134 of the P-Channel field-effect transistors 90 and 92 respectively and to the gate 152 of P-Channel field-effect transistor 88. The sources 136 and 138 of the P-Channel field-effect transistors 90 and 92 respectively are also coupled to the positive voltage supply terminal 128.

As will be seen hereinafter, before a memory cell is read, it is placed into a precharge condition. During the precharge condition, the gates 140 and 142 of the P-Channel field-effect transistors 86 and 92 and the gate 154 of N-Channel field-effect transistor 84 are maintained low. When a memory cell of the column to which the sense amplifier 70 is coupled is to be read, the gates 140, 142 and 154 are provided with a high voltage level. The low and high voltage levels at gates 140, 142 and 154 are referred to hereinafter with respect to the wave forms of FIGS. 5 and 6 as input B signals.

Lastly, the drain 130 of N-Channel field-effect transistor 82 is coupled to an input 144 of inverter 78. The output 146 of inverter 78 comprises the output of the sense amplifier 70. As will be seen hereinafter, when the sense amplifier 70 senses a high capacitance of a memory cell, it provides a low voltage at the output 146 to represent a binary zero. Conversely, when the sense amplifier 70 senses a low capacitance of a memory cell, it provides a high voltage level at output 146 representing a stored binary one.

Figure 5:
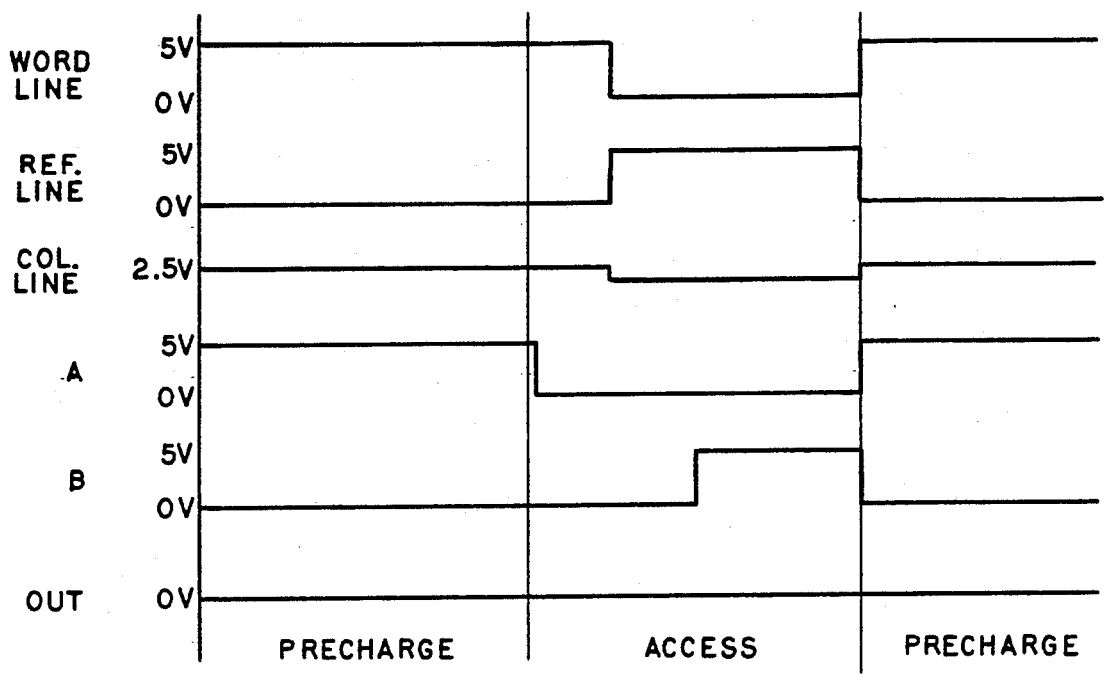
FIG. 5 is a set of wave-forms illustrating the manner in which the read-only memory of FIG. 1 may be operated to detect a binary zero stored in a memory cell thereof.

Referring now to FIG. 5, it illustrates the voltage levels obtained for operating the read-only memory of the present invention during a precharge time period, an access time period wherein a given memory cell is accessed and read and then a subsequent following precharge time period for a memory cell having a capacitance means which has a relatively high capacitance representing a stored binary zero. During precharge, the word line is maintained at +5 volts, the reference line is maintained at 0 volts, the A input of switch 100 is maintained at 5 volts, and the input signal B is maintained at 0 volts. These voltage levels result in the output of the sense amplifier being at 0 volts.

Immediately after the beginning of the access time period, input A is first changed to 0 volts and A to 5 volts. A short time thereafter, the word line is changed to 0 volts and the reference line is changed to 5 volts. The column line, during the precharge time period, remains at 2.5 volts as a result of switch 100 being closed. When the voltage on the word and reference lines are reversed, a decrease in the voltage on the column line will result by virtue of the high capacitance of the memory cell. The change in voltage on the column line may be on the order of 30 millivolts.

The decreased voltage on the column line will cause the output 96 of inverter 74 to increase by about 0.25 volts. This places a high level on gate 102 of the N-Channel filed-effect transistor 80 and a low level on the gate 108 of the N-Channel field-effect transistor 82 from the inverter 76. These input conditions cause the output 146 of inverter 78 to remain low to thus indicate that the capacitance means of the memory cell being read is of the relatively high capacitance and thus represents a stored binary zero.

Figure 6:
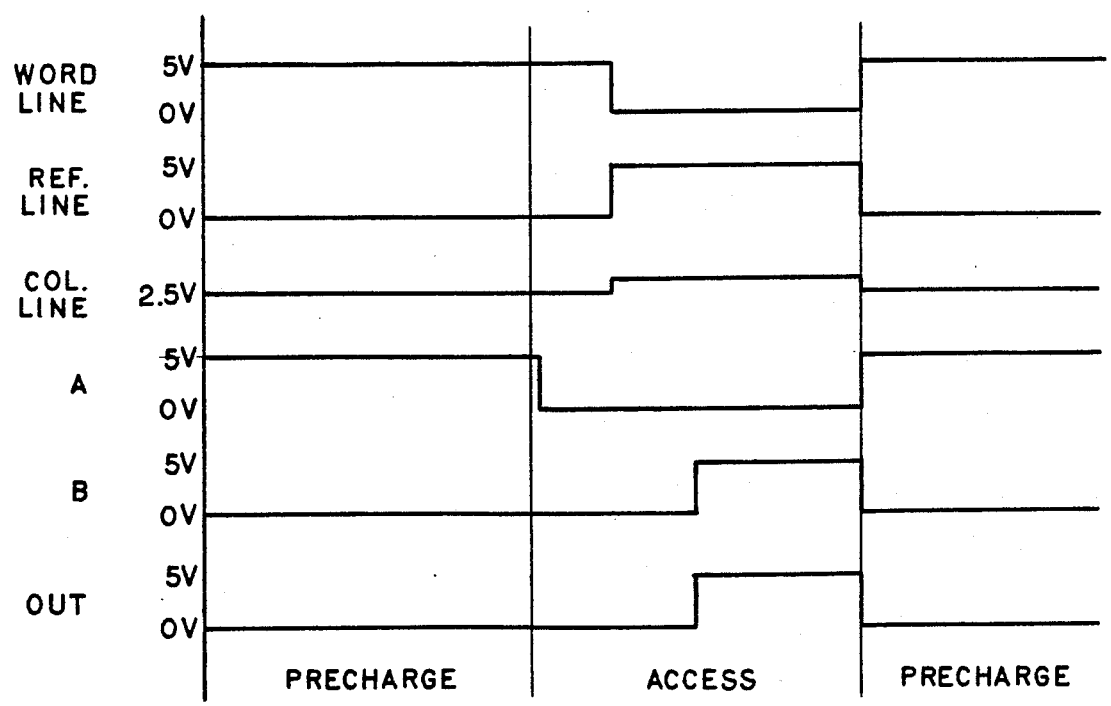
FIG. 6 is another set of wave-forms illustrating the manner in which the read-only memory of FIG. 1 may be operated to detect a binary one stored in a memory cell thereof.

Referring now to FIG. 6, it illustrates a voltage level similar to FIG. 5 for a condition wherein the capacitance means of a memory cell being read is of the relatively low capacitance representing a stored binary one. During the precharge time period, the voltage levels are the same as previously referred to with respect to FIG. 5. Shortly after the accessed time period begins, the input A is changed to 0 volts and A to 5 volts. Thereafter, the word line is from 5 volts to 0 volts and the voltage on the reference line is changed from 0 volts to 5 volts. When the voltages impressed upon the word line and reference line are reversed, the relatively low capacitance of the memory cell causes the voltage on the column line to increase by an amount on the order of 30 millivolts. The increased voltage on the column line causes the output 96 of inverter 74 to be decreased by about 0.25 volts to thus impress a low level on gate 102 of transistor 80 and a high level on gate 108 of transistor 82. These conditions result in the output 146 going high when the input B is increased from 0 volts to 5 volts to initiate the reading of the memory cell. Hence, the memory cell has a capacitance means having a relatively low capacitance, the output of the sense amplifier 70 will be a high level representing a binary one stored in the memory cell.

From the foregoing, it can be seen that the present invention provides a new and improved read-only memory. The read-only memory of the present invention is compatible with CMOS integrated circuit processing. In addition, the read-only memory of the present invention permits fabrication of the read-only memory prior to programming. As a result, the read-only memory has a long shelf-life and may be programmed through the formation of the pores and column lines at a later time. In addition, because the pores, for those memory cells which are to have a relatively high capacitance, are formed entirely through the third insulating layer to the respective conductor regions, the etching process required is relatively simple to implement. Also, because the memory cells do not incorporate transistors, high packing density is obtainable with less limitations on feature size.

While a particular embodiment of the present invention has been shown and described, modifications may be made, and it is therefore intended to cover in the appended claims all such changes and modifications which fall within the true spirit and scope of the invention.

What is claimed is:

1. A read-only memory for storing plural bits of information comprising:

a plurality of memory cells arranged in an array, each said memory cell including capacitor means having a relatively high capacitance or a relatively low capacitance for representing a bit of information stored therein, wherein said capacitor means comprises a single capacitor for providing said relatively high capacitance or a pair of series coupled capacitors for providing said relatively low capacitance.

2. A read-only memory as defined in claim 1 wherein said read-only memory is formed on a substrated and wherein each said memory cell comprises a first insulating layer overlying said substrate, a first conductor overlying said first insulating layer, a second insulating layer overlying said first conductor, said second insulating layer being relatively thin, a conductive region overlying said second insulating layer, a third insulating layer overlying said conductive region, said third insulating layer being relatively thick, and a second conductor overlying said third insulating layer, wherein said capacitor means of relatively high capacitance includes a pore formed in said third insulating layer for permitting said second conductor to electrically contact said conductor region, whereby said first conductor, said second insulating layer and said conductive region provide said relatively high capacitance between said first and second conductors, and wherein said capacitor means of relatively low capacitance includes a first and second series coupled capacitors, said first capacitor including said first conductor, said second insulating layer, and said conductive region, and said second capacitor including said conductive region, said third insulating layer, and said second conductor, whereby said first and second series coupled capacitors provide said relatively low capacitance between said first and second conductors.

3. A read-only memory as defined in claim 2 wherein said memory cells are arranged in columns and rows, wherein said first conductor of each said cell of a given row of cells are coupled together to form a plurality of substantially parallel row conductors, and wherein said second conductor of each said cell of a given column of cells are coupled together to form a plurality of substantially parallel column conductors, said row conductors and said column conductors being substantially perpendicular to each other.

4. A read-only memory as defined in claim 3 wherein said row conductors are formed from a doped polycrystalline semiconductor material.

5. A read-only memory as defined in claim 4 wherein said semiconductor material is silicon.

6. A read-only memory as defined in claim 3 wherein said column conductors are formed from metal.

7. A read-only memory as defined in claim 3 wherein said conductive region of each said memory cell is formed from metal.

8. A read-only memory as defined in claim 3 wherein said insulating layers are formed from silicon oxide.

9. A read-only memory as defined in claim 3 further including a reference conductor substantially parallel to said row conductors and a plurality of reference capacitors, each said reference capacitor being coupled between said reference conductor and a respective given one of said column conductors.

10. A read-only memory as defined in claim 9 wherein each said reference capacitor has a capacitance on the order of one-half the capacitance of said relatively high capacitance.

11. A read-only memory as defined in claim 1 further including reading means for accessing each said memory cell one at a time and for providing a first output responsive to a memory cell having said relatively high capacitance and a second output responsive to a memory cell having said relatively low capacitance.

12. A read-only memory as defined in claim 11 wherein said first output is a low logic output and said second output is a high logic output.

13. A read-only memory as defined in claim 11 wherein said memory cells are arranged in columns and rows, wherein said read-only memory further comprises a plurality of substantially parallel row conductors, each said row conductor being coupled to one side of said capacitor means of the memory cells in a respective given one of said rows and a plurality of substantially parallel column conductors, each said column conductor being coupled to the other side of said capacitor means of the memory cells in a respective given one of said columns, and wherein said reading means comprises a sense amplifier coupled to each of said column conductors.

14. A read-only memory as defined in claim 13 further including a reference conductor extending substantially parallel to said row conductors and a plurality of reference capacitors, each said reference capacitor being coupled between said reference conductor and a respective given one of said column conductors.

15. A read-only memory for storing a plurality of bits of information, said read-only memory comprising:

a plurality of memory cells arranged in an array of a plurality of substantially parallel rows and a plurality of substantially parallel columns, said rows being substantially perpendicular to said columns;

a corresponding plurality of substantially parallel row conductors and substantially parallel column conductors, said row conductors being substantially perpendicular to said column conductors;

each said memory cell including capacitor means coupled between a respective different pair of said row and column conductors, said capacitor means having a relatively high capacitance or a relatively low capacitance representing a bit of stored information; and reading means for accessing each said memory cell and providing a first or second output responsive to the capacitance level of said memory cell capacitance means, wherein said relatively high capacitance comprises a single capacitance coupled between a pair of said row and column conductors and wherein said relatively low capacitance comprises a pair of series coupled capacitances coupled between a pair of said row and column conductors.

16. A read-only memory as defined in claim 15 further including a reference conductor 17. A read-only memory as defined in claim 16 wherein said reading means comprises a sense amplifier coupled to each said column conductor.

18. A read-only memory as defined in claim 16 wherein said reference capacitors have a capacitance substantially equal to one-half said relatively high capacitance.

19. A read-only memory as defined in claim 15 wherein said high capacitance is on the order of ten times the capacitance of said relatively low capacitance.

20. A read-only memory as defined in claim 19 wherein said single capacitance has a given capacitance and said pair of series coupled capacitances comprise a first capacitance having said given capacitance and a second capacitance having one-tenth said given capacitance.

* * * * *